(12) United States Patent
Kawamura et al.

(10) Patent No.: US 9,320,162 B2
(45) Date of Patent: Apr. 19, 2016

(54) ELECTRONIC COMPONENT

(71) Applicant: Yazaki Corporation, Tokyo (JP)

(72) Inventors: Yukihiro Kawamura, Shizuoka (JP); Hiroaki Yamada, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 14/823,103

(22) Filed: Aug. 11, 2015

(65) Prior Publication Data

US 2016/0050777 A1    Feb. 18, 2016

(30) Foreign Application Priority Data

Aug. 12, 2014  (JP) .................................. 2014-164376

(51) Int. Cl.
*H05K 5/02*    (2006.01)
(52) U.S. Cl.
CPC ............ *H05K 5/0217* (2013.01); *H05K 5/0247* (2013.01); *H05K 5/0256* (2013.01); *H05K 5/0286* (2013.01)
(58) Field of Classification Search
CPC ........................... H05K 5/0256; H05K 5/0247
See application file for complete search history.

(56) References Cited

U.S. PATENT DOCUMENTS

| | | | | |
|---|---|---|---|---|
| 5,192,082 A * | 3/1993 | Inoue | .................... | H05K 5/0256 463/44 |
| 5,659,459 A * | 8/1997 | Wakabayashi | ......... | B41J 29/377 174/51 |
| 6,312,338 B1 * | 11/2001 | Sato | ...................... | H05K 5/0256 463/44 |
| 6,404,647 B1 * | 6/2002 | Minne' | ................. | G06F 3/0626 361/679.32 |
| 2002/0131241 A1 * | 9/2002 | Boyer | .................. | H05K 5/0256 361/724 |
| 2003/0021090 A1 * | 1/2003 | Miksch | ................ | H05K 5/0021 361/725 |
| 2003/0043564 A1 * | 3/2003 | Barringer | ............. | H05K 7/1409 361/807 |
| 2004/0029447 A1 * | 2/2004 | Neer | ..................... | H05K 5/0256 439/638 |
| 2004/0040871 A1 * | 3/2004 | Kakinoki | ............. | H05K 5/0256 206/307 |
| 2015/0382497 A1 * | 12/2015 | Kawamura | ............... | H05K 7/14 361/728 |

FOREIGN PATENT DOCUMENTS

JP         2010-221787 A        10/2010

* cited by examiner

*Primary Examiner* — Hung V Ngo
(74) *Attorney, Agent, or Firm* — Sughrue Mion, PLLC

(57) ABSTRACT

An electronic component includes a housing formed to have a box shape, and a terminal derived from inside to outside of the housing to be exposed and extending along a wall surface of the housing. The housing includes a pair of projecting portions formed by causing both external ends of end portions in an end surface on a side where the terminal is derived to project beyond the terminal. The external ends are external ends in a width direction crossing an extending direction in which the terminal extends. The end portions are located on a deriving source side in the extending direction. The terminal has an exposed portion that is located on an imaginary plane, or closer to the wall surface than the imaginary plane is. The imaginary plane includes a pair of corner portions of the wall surface facing the terminal and end portions of the projecting portions.

12 Claims, 6 Drawing Sheets

… (1)

ELECTRONIC COMPONENT

CROSS-REFERENCE TO RELATED APPLICATION(S)

The present application claims priority to and incorporates by reference the entire contents of Japanese Patent Application No. 2014-164376 filed in Japan on Aug. 12, 2014.

BACKGROUND OF THE INVENTION

1. Field of the Invention

The present invention relates to an electronic component.

2. Description of the Related Art

As a conventional electronic component mounted on a vehicle or the like, for example, Japanese Patent Application Laid-open No. 2010-221787 discloses an electrical junction box (junction box) including an electronic component such as a relay module for controlling connection between the power supply device and electrical equipment.

The electronic component mounted on the electrical junction box disclosed in above Japanese Patent Application Laid-open No. 2010-221787 is required to properly protect a terminal of the electronic component from damage when, for example, the electronic component is mounted on the electrical junction box.

SUMMARY OF THE INVENTION

The present invention has been made in view of the above circumstances, and is aimed at providing an electronic component that is capable of protecting its terminal.

It is an object of the present invention to at least partially solve the problems in the conventional technology.

The above object of the present invention is achieved by the following configurations.

According to one aspect of the present invention, an electronic component includes a housing formed to have a box shape; and a terminal derived from inside to outside of the housing to be exposed and extending along a wall surface of the housing. Here, the housing includes a pair of projecting portions formed by causing both external ends of end portions in an end surface on a side where the terminal is derived to project beyond the terminal, the external ends are external ends in a width direction crossing an extending direction in which the terminal extends, the end portions are located on a deriving source side in the extending direction. The terminal has an exposed portion which is located on an imaginary plane, or closer to the wall surface than the imaginary plane is, the imaginary plane includes a pair of corner portions of the wall surface facing the terminal and end portions of the projecting portions, the corner portions are located on a distal end side in the extending direction of the terminal and at both external ends in the width direction, and the end portions are located on a drawing side of the terminal, on the corner portions side, and on an external end side in the width direction.

According to another aspect of the present invention, a distal end position of the terminal in the extending direction is located on the imaginary plane, or located closer to the wall surface than the imaginary plane is.

According to still another aspect of the present invention, the housing includes a plate-like portion connecting the projecting portions, and the projecting portions have a larger length in the extending direction than a length of the plate-like portion.

According to still another aspect of the present invention, the terminal is located inner than outermost positions in the width direction of the wall surface facing the terminal.

According to still another aspect of the present invention, the imaginary plane is a plane on one side of which the whole housing is located with the imaginary plane serving as a boundary.

According to still another aspect of the present invention, an electronic component includes a housing formed to have a box shape; and a terminal derived from inside to outside of the housing to be exposed and extending along a wall surface of the housing. Here, the housing includes a pair of projecting portions formed by causing both external ends of end portions in an end surface on a side where the terminal is derived to project beyond the terminal, the external ends are external ends in a width direction crossing an extending direction in which the terminal extends, the end portions are located on a deriving source side in the extending direction. The terminal has an exposed portion which is located on an imaginary plane, or closer to the wall surface than the imaginary plane is, the imaginary plane includes a pair of corner portions of the wall surface facing the terminal and corner portions of the projecting portions, the corner portions of the wall surface are located on a distal end side in the extending direction of the terminal and at both external ends in the width direction, and the imaginary plane is a plane on one side of which the whole housing is located with the plane serving as a boundary.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

An embodiment according to the present invention will be explained in detail hereinafter with reference to drawings. The present invention is not limited by the embodiment. The constituent elements in the following embodiment include elements that one skilled in the art can replace and are obvious to one skilled in the art, or substantially identical.

Embodiment

Figure 1:
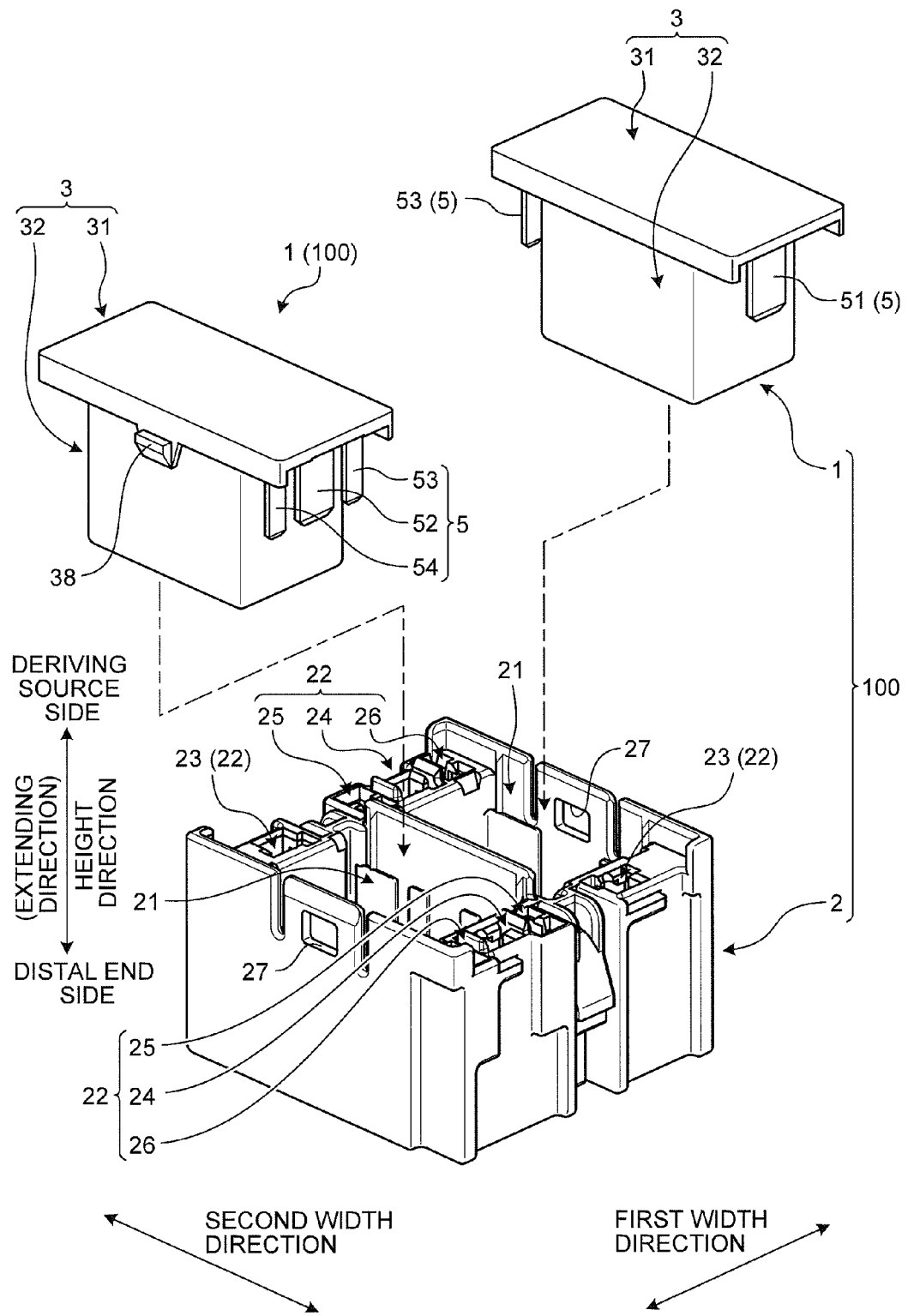
FIG. 1 is an exploded perspective view of an electronic component unit to which an electronic component according to an embodiment is applied.
Figure 2:
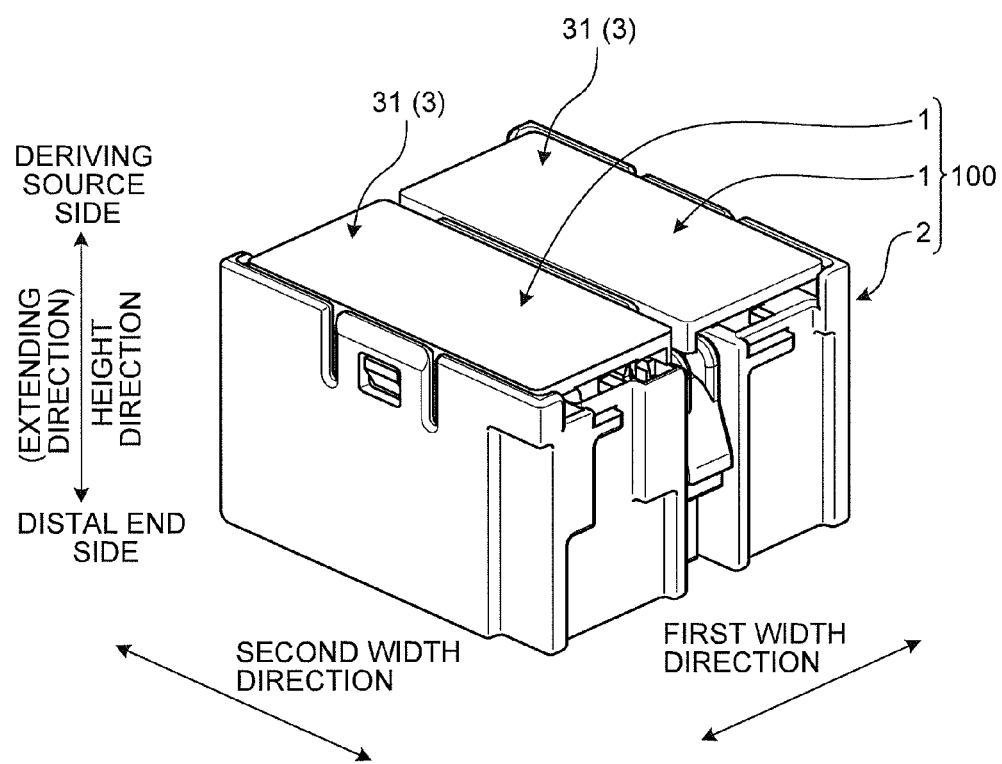
FIG. 2 is a perspective view of the electronic component unit to which the electronic component according to the embodiment is applied.
Figure 3:
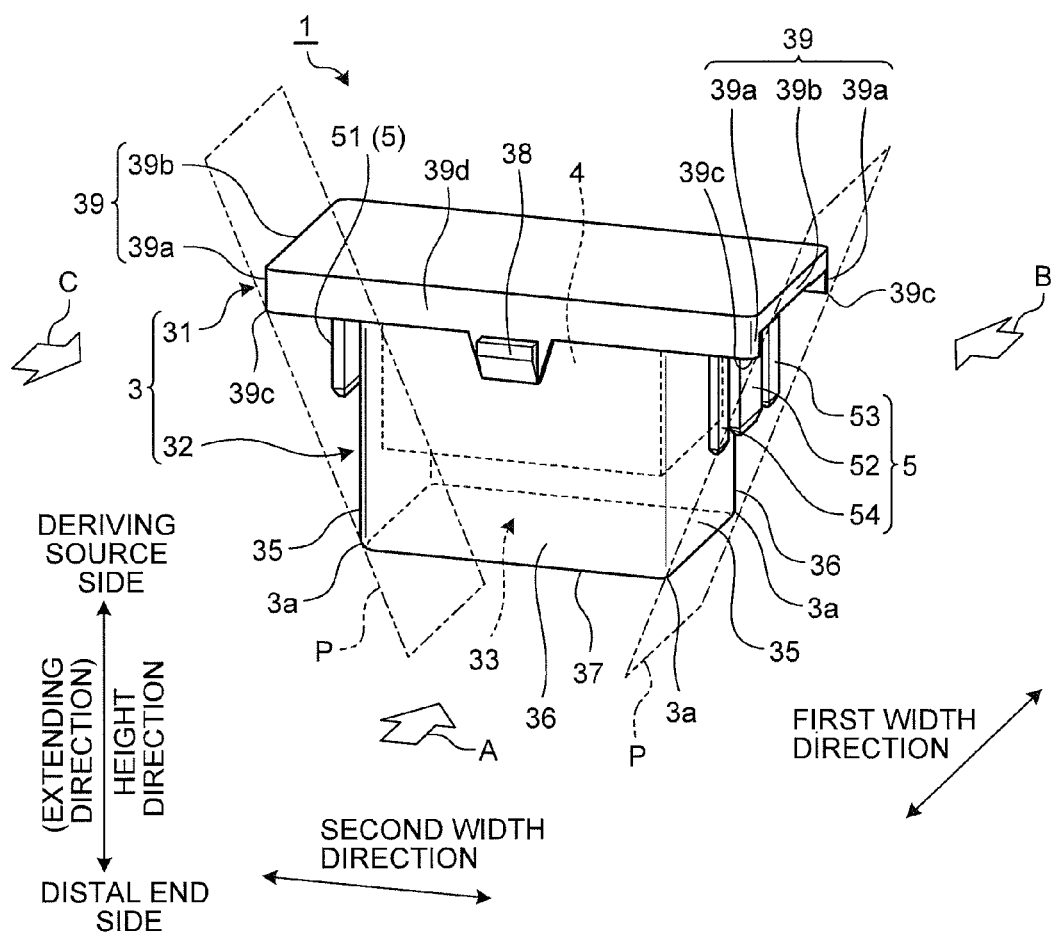
FIG. 3 is a perspective view illustrating a schematic structure of the electronic component according to the embodiment.
Figure 4:
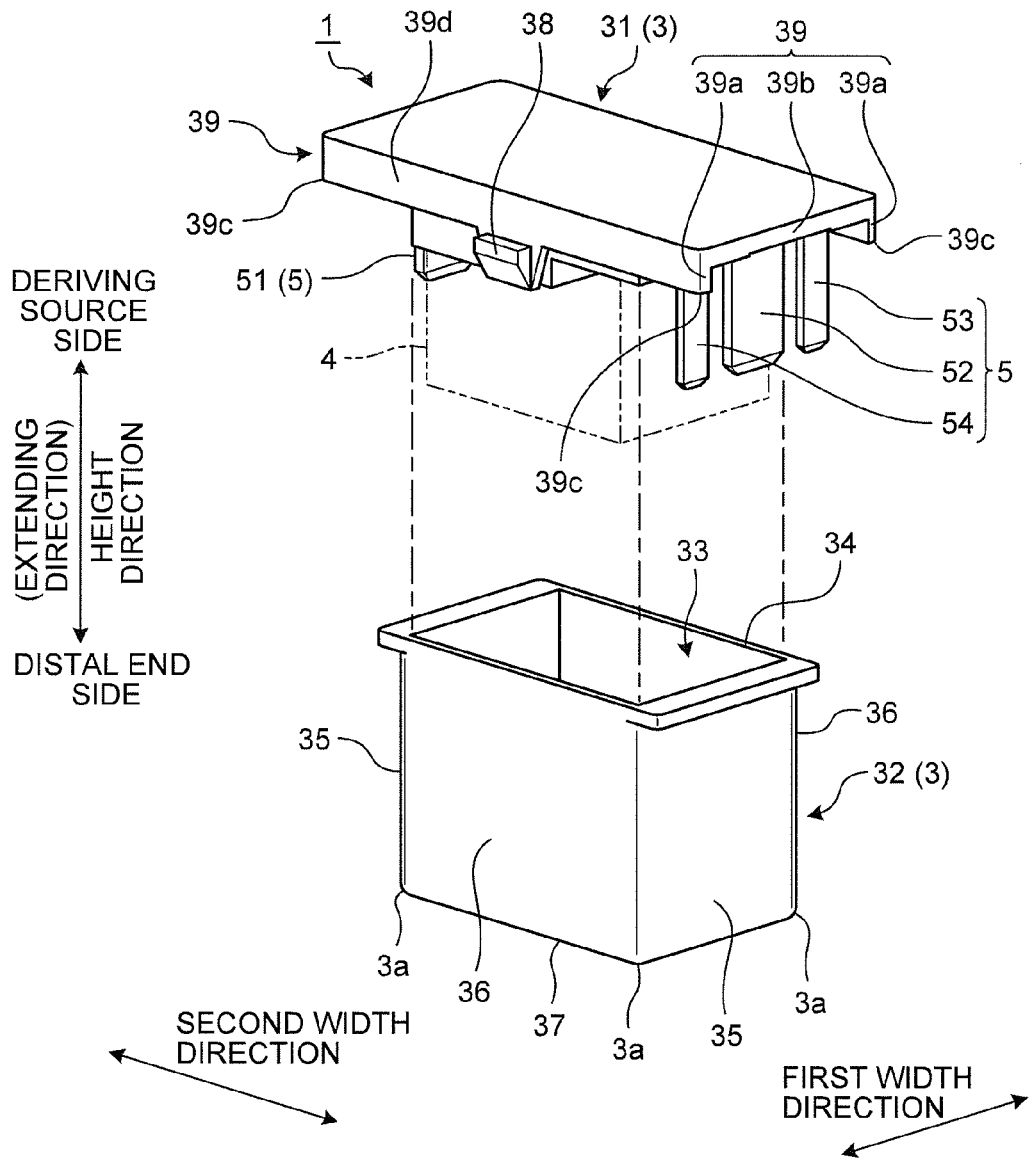
FIG. 4 is an exploded perspective view illustrating a schematic structure of the electronic component according to the embodiment.
Figure 5:
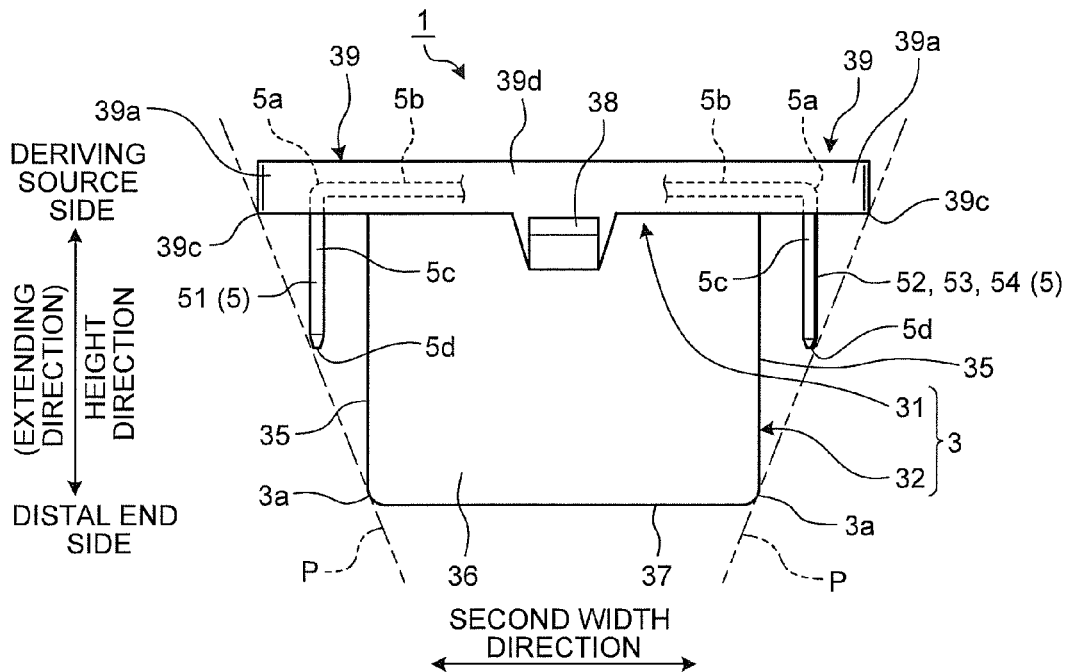
FIG. 5 is a side view of a long-side side of the electronic component according to the embodiment.
Figure 6:
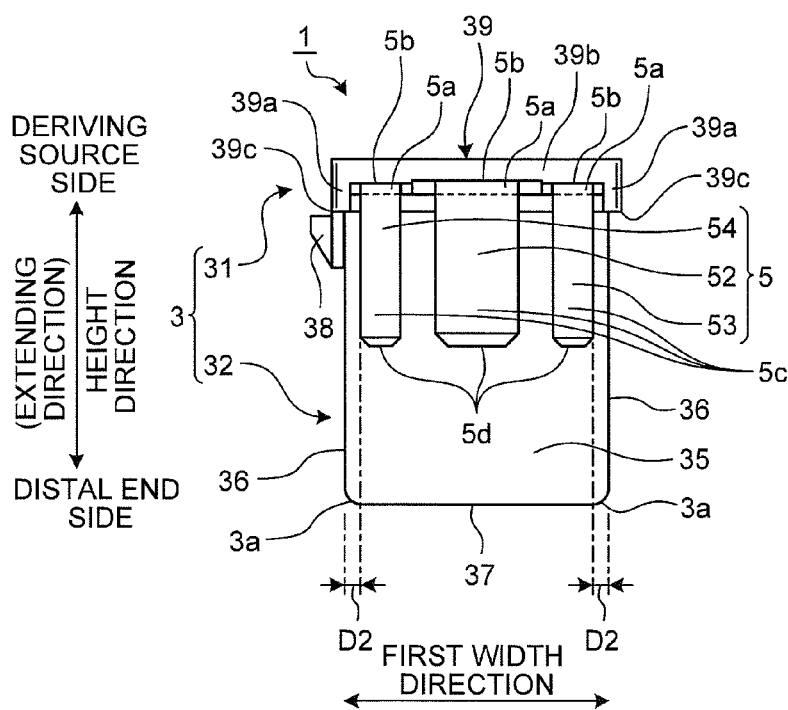
FIG. 6 is a side view of a short-side side of the electronic component according to the embodiment.
Figure 7:
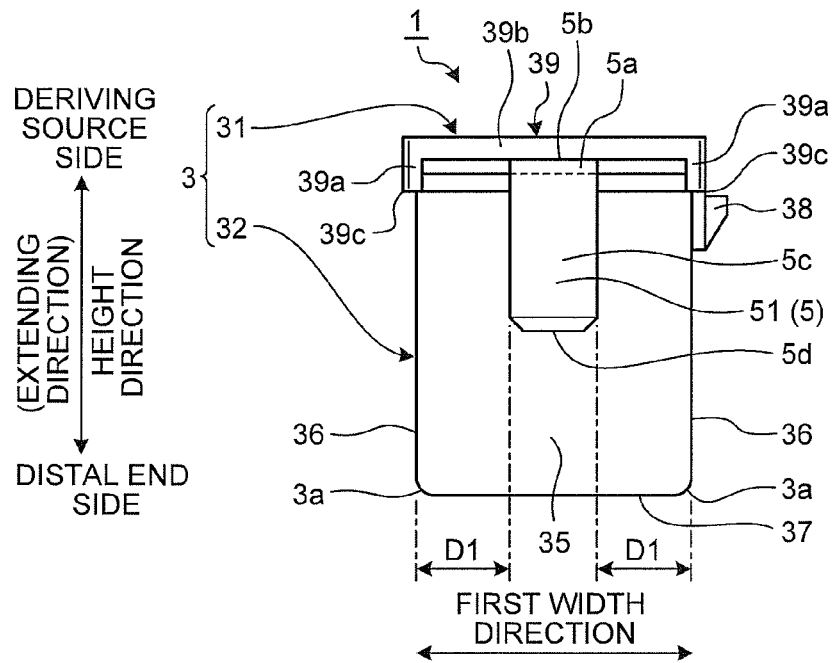
FIG. 7 is a side view of a short-side side of the electronic component according to the embodiment.
Figure 8:
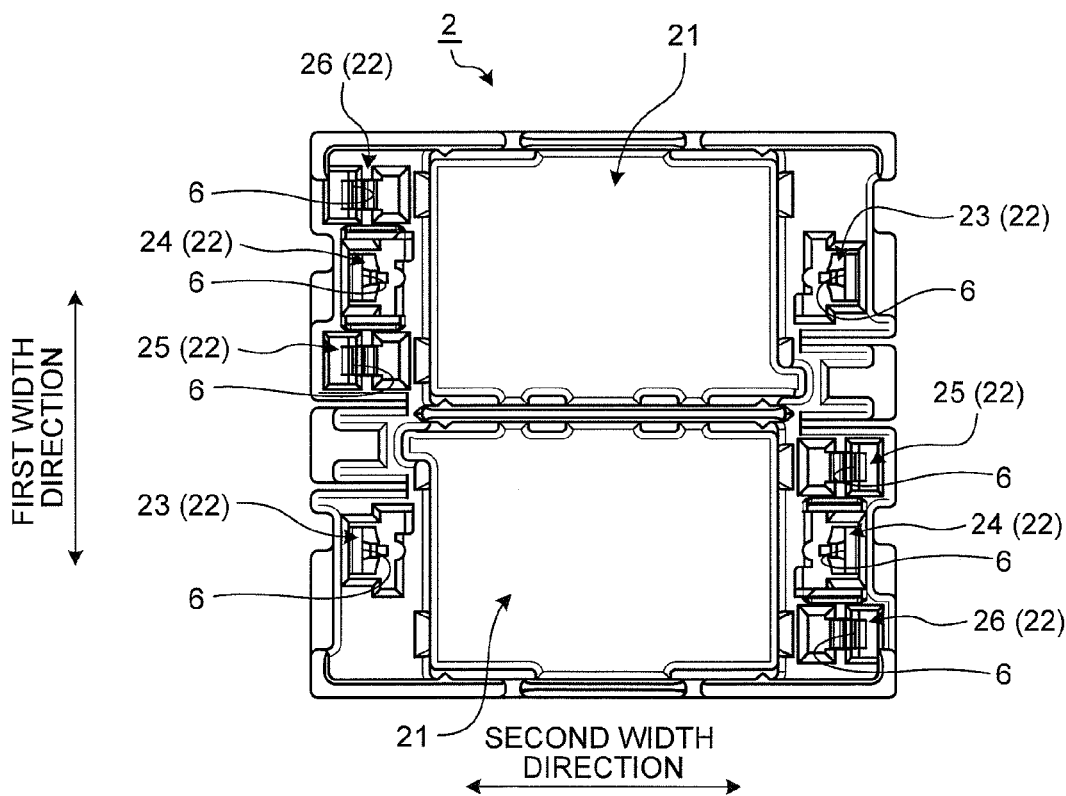
FIG. 8 is a plan view of a housing member on which the electronic component according to the embodiment is mounted.

FIG. 1 is an exploded perspective view of an electronic component unit to which an electronic component according to the embodiment is applied. FIG. 2 is a perspective view of the electronic component unit to which the electronic component according to the embodiment is applied. FIG. 3 is a perspective view illustrating a schematic structure of the electronic component according to the embodiment. FIG. 4 is an exploded perspective view illustrating a schematic structure of the electronic component according to the embodiment. FIG. 5 is a side view of a long-side side of the electronic component according to the embodiment (view taken in a direction of arrow A illustrated in FIG. 3). FIG. 6 is a side view of a short-side side of the electronic component according to the embodiment (view taken in a direction of arrow B illustrated in FIG. 3). FIG. 7 is a side view of a short-side side of the electronic component according to the embodiment (view taken in a direction of arrow C illustrated in FIG. 3). FIG. 8 is a plan view of a housing member on which the electronic component according to the embodiment is mounted. FIG. 4 illustrates the main body of the electronic component with two-dot chain lines.

As illustrated in FIG. 1 and FIG. 2, electronic components 1 according to the present embodiment are applied to an electronic component unit 100, and detachably mounted on an electrical junction box mounted on a vehicle such as an automobile. The electrical junction box contains therein together electrical equipment such as connectors, fuses, relays, branch parts, and electronic control units that form connection processing components such as wire harnesses and wires. For example, the electrical junction box is installed in an engine room of the vehicle or a lower portion of the vehicle body, and connected between a power supply such as a battery and various electronic devices mounted in the vehicle. The electrical junction box distributes electric power supplied from the power supply to the electronic devices in the vehicle. Although electrical junction boxes may also be referred to as junction boxes, fuse boxes, or relay boxes, they are collectively called electrical junction boxes in the present embodiment. The electrical junction box has the structure in which a housing including a frame, an upper cover, and a lower cover that are formed of an insulating synthetic resin houses various electronic components including the electronic component 1. The electrical junction box has the structure in which the respective electronic components including the electronic components 1 are mounted in a number of cavities formed of partition walls of various shapes that are integrally formed on the frame and blocks of various shapes that are detachably mounted on the frame. The electrical junction box has the structure in which terminals of wires and the like are fitted with and electrically connected with the cavities on which the various electronic components including the electronic components 1 are mounted.

The electronic component unit 100 to which the electronic component 1 according to the present embodiment is applied includes the electronic components 1 and a housing member 2. Although the electronic component unit 100 illustrated in FIG. 1 and FIG. 2 is illustrated with the structure of including two electronic components 1, the electronic component unit 100 is not limited thereto, and may include one electronic component 1 or three or more electronic components 1. The two electronic components 1 have an equal structure.

Each of the electronic components 1 includes a housing 3, an electronic component main body 4, and a terminal 5, as illustrated in FIG. 3, FIG. 4, FIG. 5, FIG. 6, and FIG. 7.

In the following explanation, the extending direction in which the terminal 5 exposed to the outside of the housing 3 extends may be referred to as the "height direction", one side of the extending direction (height direction) may be referred to as the "deriving source side", and the other side of the extending direction may be referred to as the "distal end side". In the following explanation, two directions that are orthogonal to the extending direction (height direction) may be referred to as the "first width direction" and the "second width direction". Typically, the extending direction (height direction) serving as the first direction, the first width direction serving as the second direction, and the second width direction serving as the third direction are mutually orthogonal.

The housing 3 houses the electronic component main body 4 therein. The housing 3 is a vessel that is formed in a box shape. The housing 3 includes a base 31 and a case 32. Both the base 31 and the case 32 are formed of an insulating synthetic resin. The base 31 is a lid-like member formed in a rectangular plate shape, and the electronic component main body 4 is mounted on the base 31. The base 31 has the short-side direction in the first width direction, and has the long-side direction in the second width direction. The case 32 is a box-like member formed in a hollow rectangular parallelepiped box shape, to cover the electronic component main body 4 mounted on the base 31. The case 32 has a hollow portion formed therein and serving as a housing space portion 33 to house the electronic component main body 4. The housing space portion 33 is provided with an opening 34 in the case 32 on the deriving source side in the height direction (extending direction) (see FIG. 4, for example). In the case 32, the housing space portion 33 is partitioned by a pair of wall surfaces 35 that are opposed in the second width direction, a pair of wall surfaces 36 that are opposed in the first width direction, and a bottom surface 37 located on the distal end side in the height direction. The case 32 is provided with the opening 34 on the deriving source side in the height direction. The case 32 includes four side surfaces formed of the wall surfaces 35 and the wall surfaces 36. The base 31 in the state where the electronic component main body 4 is mounted thereon is mounted on the case 32 in a positional relation in which the base 31 covers the opening 34 of the case 32, and engaged by an engaging mechanism of various forms (see FIG. 4, for example). Specifically, housing 3 has the structure in which the base 31 is located on the deriving source side in the height direction, and the case 32 is located on the distal end side in the height direction. The housing 3 has the structure in which the base 31 and the case 32 are combined to form a rectangular parallelepiped box shape as a whole and to house the electronic component main body 4 in the housing space portion 33 formed inside. The housing 3 is provided with an engaging projection portion 38 in one end surface extending along the second width direction (long-side direction) in the base 31. The engaging projection portion 38 is an engaging hook to be engaged with the housing member 2 described later, and formed in substantially the center of the second width direction.

The electronic component main body 4 is housed inside the housing 3. The electronic component main body 4 is a component used for electrical products, and is a component such as a connector, a fuse, a relay, a branch part, and an electronic control unit. Suppose that the electronic component main body 4 is, for example, a relay (electromagnetic relay) that physically moves a contact point by an electromagnet formed of a coil or the like to control connection between the power supply device and the electrical equipment.

The terminal 5 is derived from the inside to the outside of the housing 3 to be exposed, and extends along the wall surface of the housing 3, that is, the wall surface 35 that forms the end surface in the second width direction (long-side direction) in the case 32 of the housing 3, in this example. The terminal 5 is a plate-like lead terminal formed of a conductive metal bus bar that is electrically connected with the electronic component main body 4. The terminal 5 may be referred to as a tab. In this example, the electronic component 1 includes a plurality of terminals 5. More specifically, the electronic component 1 includes four terminals, that is, a first terminal 51, a second terminal 52, a third terminal 53, and a fourth terminal 54, as the terminals 5. The first terminal 51 extends to face one wall surface 35 that forms an end surface in the second width direction (long-side direction) in the case 32. The second terminal 52, the third terminal 53, and the fourth terminal 54 extend to face the other wall surface 35 that forms the other end surface in the second width direction in the case 32. Specifically, the first terminal 51, and the second terminal 52, the third terminal 53, and the fourth terminal 54 project in directions away from each other in the second width direction, in the respective wall surfaces 35 that are opposed in the second width direction in the housing 3, and are formed along the respective wall surfaces 35. The first terminal 51 is located in substantially the center in the first width direction of one wall surface 35 (see FIG. 7, for example). With respect to the second terminal 52, the third terminal 53, and the fourth terminal 54, the second terminal 52 is located in substantially the center in the first width direction of the other wall surface 35, and the third terminal 53 and the fourth terminal 54 are located on both sides of the second terminal 52 in the first width direction with a space from the second terminal 52 (see FIG. 6, for example). Among the second terminal 52, the third terminal 53, and the fourth terminal 54, the second terminal 52 is formed relatively wider than the third terminal 53 and the fourth terminal 54. In the following explanation, the first terminal 51, the second terminal 52, the third terminal 53, and the fourth terminal 54 may be simply referred to as "terminals 5" when it is unnecessary to distinguish them in the explanation.

More specifically, each of the terminals 5 is derived and exposed from the electronic component main body 4 to the outside of the housing 3. Each of the terminals 5 is derived from the inside to the outside of the housing 3 on the base 31 side, that is, the deriving source side in the height direction, and extends toward the distal end side in the height direction. Each of the terminals 5 projects along the second width direction on the base 31 side, that is, the deriving source side in the height direction, and is bent toward the distal end side in the height direction via a bent portion 5a (see FIG. 6 and FIG. 7, for example). Each of the terminals 5 projects to extend along the wall surface 35 toward the distal end side in the height direction. With this structure, each of the terminals 5 has a shape of projecting from the wall surface 35 forming the end surface in the second width direction in the case 32 of the housing 3, to have a space from the wall surface 35 and to go away from the wall surface 35, and projecting from the housing 3. Each of the terminals 5 includes a proximal end portion (deriving portion) 5b (see FIG. 5, FIG. 6, and FIG. 7, for example) that projects along the second width direction on the deriving source side in the height direction, and a contact portion 5c (see FIG. 5, FIG. 6, and FIG. 7, for example) that contacts the other end's terminal 6 on the distal end side in the height direction, with the bent portion 5a interposed therebetween. The terminals 5 have substantially equal positions of the bent portions 5a in the height direction, and substantially equal positions of distal ends 5d (see FIG. 5, FIG. 6, and FIG. 7, for example). The portion on the proximal end portion 5b side (specifically, the electronic component main body 4 side) of each of the terminals 5 is integrally provided on the surface of the base 31 located on the distal end side in the height direction, by insert molding or the like, for example.

The housing 3 according to the present embodiment further includes bulging portions 39. Each bulging portion 39 is a portion like eaves bulging from the case 32 in the base 31. Each bulging portion 39 bulges from the case 32 in the second width direction. Each bulging portion 39 is an end portion of the end surface of the base 31 on the side on which the terminals 5 are derived, and formed such that the end portion thereof on the deriving source side in the extending direction of the terminals 5 projects more than the terminals 5 to the drawing side of the terminals 5. Specifically, the bulging portion 39 is an end portion of the end surface on each wall surface 35 side opposed to the terminal 5 in the base 31, and formed such that the end portion thereof on the deriving source side in the extending direction of the terminals 5 projects more than each terminal 5 in the direction away from the wall surface 35 to cover the deriving source side of each terminal 5 in the height direction. A pair of bulging portions 39 are provided on respective sides of the base 31 in the second width direction.

More specifically, each bulging portion 39 has a pair of projecting portions 39a and a plate-like portion 39b. The projecting portions 39a are formed of both external ends in the width direction of the end portion on the deriving source side in the extending direction in which each terminal 5 extends, in the end surface of the base 31 on the side where each terminal 5 is derived. Both external ends project more than each terminal 5 toward the drawing side of the terminal 5. In other words, the projecting portions 39a are both external ends in the width direction of the end portion on the deriving source side in the extending direction of each terminal 5, in the end surface of the base 31 on each wall surface 35 side, and the external ends project more than each terminal 5 in a direction away from the wall surface 35. The projection amounts of the projecting portions 39a are substantially equal to each other. The plate-like portion 39b is a portion like a plate connecting the projecting portions 39a with each other. The plate-like portion 39b is formed to extend along the first width direction and fill up the space between the projecting portions 39a. The projecting portions 39a are formed to have a larger length in the height direction (extending direction) than that of the plate-like portion 39b. Each of the projecting portions 39a is formed to have an end portion 39c on the distal end side in the height direction (extending direction), and the end portion 39c projects from the plate-like portion 39b toward the distal end side in the height direction. Specifically, each bulging portion 39 is formed to have a substantially U shape, in which the pair of projecting portions 39a and the plate-like portion 39b are integrally formed, and have an opening facing the distal end side in the height direction in side view (the side surface on the short-side side illustrated in FIG. 6 and FIG. 7) as viewed from the second width direction. Each projecting portion 39a on one side in the second width direction and each projecting portion 39a on the other side form a beam-like portion 39d that is continuous along the second width direction. Each beam-like portion 39d is formed on each end surface in the first width direction of the base 31 along the second width direction. The engaging projection portion 38 described above is formed in substantially the center in the second width direction of one of the beam-like portions 39d.

The bulging portions 39 of the base 31 cover the deriving source sides in the height direction of the terminals 5 described above. Although each of the terminals 5 is illustrated with the bent portion 5a being located outside the housing 3 and in the vicinity of the surface of the bulging portion 39 located on the distal end side in the height direction as illustrated in FIG. 6 and FIG. 7, for example, the structure thereof is not limited to the above. For example, each terminal 5 may be integrally provided with the base 31 to project from the bulging portion 39 directly toward the distal end side in the height direction and extend along the wall surface 35. Specifically, for example, each terminal 5 may be formed such that the bent portion 5a and the proximal end portion 5b are surrounded by the synthetic resin forming the base 31 and the contact portion 5c projects toward the distal end side in the height direction and extends along the wall surface 35.

As illustrated in FIG. 1, FIG. 2, and FIG. 8, the housing member 2 is a housing member into which the electronic components 1 are inserted to house the electronic components 1. For example, the housing member 2 may be part of the frame forming the electrical junction box, or part of the block mounted on the frame, or may be mounted on the frame or the block. The housing member 2 also serves as a holding member to hold the other end's terminal 6. The other end's terminal 6 is a terminal to be fitted with each terminal 5.

The housing member 2 includes main cavities 21 serving as first housing chambers to be fitted with the respective housings 3 of the electronic components 1, and sub cavities 22 serving as second housing chambers to hold the other end's terminals 6 and to be fitted with the terminals 5 of the electronic components 1. The housing member 2 includes wall surfaces such as partition walls that partition the main cavities 21 and the sub cavities 22, and is formed of an insulating synthetic resin and in a substantially rectangular parallelepiped box shape as a whole.

Each of the main cavities 21 is a space portion formed in a substantially rectangular parallelepiped shape having a size and a shape to accommodate the case 32 of the housing 3. Each of the main cavities 21 guides the case 32 of the housing 3 through an opening on the deriving source side in the height direction to house the case 32 therein. In this example, the two main cavities 21 are formed to correspond to the two electronic components 1. The two main cavities 21 are provided adjacent to each other in the first width direction. Each main cavity 21 has the long-side direction in the second width direction and the short-side direction in the first width direction.

Each of the sub cavities 22 is a space portion extending along the height direction with a size and a shape that accommodate each terminal 5. Each of the sub cavities 22 holds the other end's terminal 6 therein, and guides the distal end 5d of each terminal 5 through the opening on the deriving source side in the height direction to house each terminal 5 therein. A plurality of sub cavities 22 are formed to correspond to the terminals 5 of each electronic component 1. The housing member 2 includes, as the sub cavities 22, eight sub cavities that are formed of two pairs of four sub cavities, and the two pairs correspond to the respective electronic components 1. Each of the two pairs is formed of a first cavity 23 to be fitted with the first terminal 51, a second cavity 24 to be fitted with the second terminal 52, a third cavity 25 to be fitted with the third terminal 53, and a fourth cavity 26 to be fitted with the fourth terminal 54. One sub cavity 22 has the structure in which the first cavity 23 is formed on one side in the second width direction of one of the main cavities 21, and the second cavity 24, the third cavity 25, and the fourth cavity 26 are formed on the other side in the second width direction of the main cavity 21, to hold the main cavity 21 therebetween in the second width direction. The second cavity 24, the third cavity 25, and the fourth cavity 26 are formed at certain intervals along the first width direction. In this example, the second cavity 24 is located in the center, and the third cavity 25 and the fourth cavity 26 are formed on the respective sides of the second cavity 24 in the first width direction. The first cavity 23, the second cavity 24, the third cavity 25, and the fourth cavity 26 of the sub cavity 22 for the other main cavity 21 are also formed in the same manner. However, point-symmetry shapes and point-symmetry positional relation are achieved between the group including one main cavity 21, and the first cavity 23, the second cavity 24, the third cavity 25, and the fourth cavity 26 formed to hold the main cavity 21 therebetween and the group including the other main cavity 21, and the first cavity 23, the second cavity 24, the third cavity 25, and the fourth cavity 26 formed to hold the other main cavity 21 therebetween. In other words, their shapes and positional relation are obtained by rotating one of the groups by 180° around the axis extending in the height direction. Each first cavity 23, each second cavity 24, each third cavity 25, and each fourth cavity 26 correspond to the first terminal 51, the second terminal 52, the third terminal 53, and the fourth terminal 54, respectively, to hold the other end's terminals (female terminals in this example) 6 in predetermined positions. The other end's terminals 6 are fitted and electrically connected with the contact portions 5c of the terminals 5, formed of conductive terminal metal fittings, and electrically connected with electrical wires or the like, for example.

The housing member 2 is also provided with engaging recessed portions 27 on the respective wall surfaces that partition the respective main cavities 21. Each of the engaging recessed portions 27 is engaged with the above engaging projecting portion 38 formed in the base 31, to lock the electronic component 1 in the housing member 2. Each of the engaging recessed portions 27 is formed in the wall surface extending along the second width direction (long-side direction).

In the electronic component unit 100 structured as described above, the case 32 of the housing 3 of each electronic component 1 is fitted into and housed in the main cavity 21, and the terminals 5 (the first terminal 51, the second terminal 52, the third terminal 53, and the fourth terminal 54) are fitted into and housed in the respective sub cavities 22 (the first cavity 23, the second cavity 24, the third cavity 25, and the fourth cavity 26). With this structure, the electronic component unit 100 enables electrical connection between the terminals 5 of each electronic component 1 and the other end's terminals 6 held in the housing member 2. In the electronic component unit 100, the engaging projecting portion 38 formed in the base 31 is engaged with the engaging recessed portion 27 formed in the housing member 2 in the state where the terminals 5 are electrically connected with the other end's terminals 6, and thereby each electronic component 1 is locked in the housing member 2 (see FIG. 2, for example). The electronic component unit 100 has the positional relation in which the base 31 of the housing 3 covers the main cavity 21 and the sub cavity 22 in the height direction in the state where each electronic component 1 is locked in the housing member 2.

In addition, each electronic component 1 according to the present embodiment is aimed at protecting the terminals 5, with the structure in which the bulging portions 39 and the terminals 5 of the base 31 are formed such that geometrical positional relation between the bulging portions 39 and the terminals 5 is predetermined positional relation, while each electronic component 1 is aimed at reducing height by forming each of the terminals 5 along the wall surfaces 35 on the side of the housing 3.

Specifically, as illustrated in FIG. 3 and FIG. 5, each electronic component 1 has the structure in which the exposed portion of each terminal 5 has a length in the height direction that is set in accordance with imaginary planes P, each of which is defined by the bulging portion 39 and the corner portions 3*a* of the housing 3.

Each of the imaginary planes P is an imaginary plane for the wall surface 35 that the terminal 5 faces, and includes a pair of corner portions 3*a* and the end portions 39*c* of the projecting portions 39*a* forming the bulging portion 39. Each pair of the corner portions 3*a* are corner portions of the wall surface 35 facing the terminal 5 in the case 32, and serve as corner portions located on the distal end side in the extending direction of the terminals 5 and located at the external ends in the width direction. The end portions 39*c* of the projecting portions 39*a* are end portions of a pair of projecting portions 39*a*, and serve as end portions located on the drawing side of the terminals 5, on the corner portions 3*a* side, and the external end side in the width direction. Specifically, the end portions 39*c* are end portions located on the distal end side in the extending direction and in outermost positions in the width direction on the distal end surfaces of the projecting portions 39*a*. Each imaginary plane P that is defined by a pair of corner portions 3*a* and end portions 39*c* of a pair of projecting portions 39*a* as described above is a plane, on one side of which the whole housing 3 is located with the imaginary plane P serving as the boundary.

Specifically, each imaginary plane P corresponds to a plane including a pair of corner portions 3*a* serving as corner portions of the wall surface 35 facing the terminal 5 and located on the distal end side in the extending direction of the terminal 5 and external ends in the width direction, and corner portions of a pair of projecting portions 39*a*, that is, the end portions 39*c* in this example, and the whole housing 3 is located on one side of the plane with the plane serving as the boundary.

The exposed portion of each terminal 5 is located on the imaginary plane P defined as described above, or located closer to the wall surface 35 than the imaginary plane P is. In other words, each of the terminals 5 is disposed in a space partitioned by the wall surface 35, the surface of the bulging portion 39 of the base 31 located on the distal end side in the extending direction, and the imaginary plane P. Specifically, the length of each of the terminals 5 in the height direction is set such that the position (distal end position) of the distal end 5*d* in the extending direction is located on the imaginary plane P, or closer to the wall surface 35 than the imaginary plane P is, and the contact portion 5*c* serving as the exposed portion of each terminal 5 is located closer to the wall surface 35 than the imaginary plane P is. Conversely, the bulging amount (projecting amount along the second width direction) of each bulging portion 39 including the projecting portions 39*a* is set such that the position of the distal end 5*d* of each terminal 5 is located on the imaginary plane P, or closer to the wall surface 35 than the imaginary plane P is. The exposed portion of the first terminal 51 is located on the imaginary plane P, or closer to the wall surface 35 located on one side in the second width direction than the imaginary plane P is. The exposed portions of the second terminal 52, the third terminal 53, and the fourth terminal 54 are located on the imaginary plane P, or closer to the wall surface 35 located on the other side in the second width direction than the imaginary plane P is. The whole exposed portion, including the distal end 5*d*, of each of the terminals 5 is more preferably located closer to the wall surface 35 than the imaginary plane P is.

As illustrated in FIG. 6 and FIG. 7, each of the terminals 5 is located inner than the outermost positions in the first width direction of the wall surface 35 facing the terminal 5. The first terminal 51 is formed such that each of the end portions thereof in the first width direction is located with a space D1 from the outermost position in the first width direction of the wall surface 35 (see FIG. 7). The second terminal 52, the third terminal 53, and the fourth terminal 54 are formed such that the end portion of the third terminal 53 located on one side in the first width direction and the end portion of the fourth terminal 54 located on the other side in the first width direction are located with a space D2 from the respective outermost positions in the first width direction of the wall surface 35 (see FIG. 6).

Each electronic component 1 having the above structure enables the corner portions 3*a* and the projecting portions 39*a* to contact a surface on which the electronic component 1 has fallen, before the exposed portions of the terminals 5 contact the surface, for example, when the electronic component 1 falls by accident. With this structure, the electronic component 1 prevents the terminals 5 from colliding with the surface on which the electronic component 1 has fallen, for example. In addition, the electronic component 1 enables the outermost positions in the first width direction of each of the wall surfaces 35 to contact the surface on which the electronic component 1 has fallen, before the exposed portions of the terminals 5 contact the surface, for example, even when the whole electronic component 1 is rotated around the rotation axis being a line connecting the corner portion 3*a* with the end portion 39*c* of the projecting portion 39*a* after the projecting portions 39*a* have collided with the surface. With this structure, the electronic component 1 more securely prevents the terminals 5 from colliding with the surface on which the electronic component 1 has fallen, for example.

The electronic component 1 explained above includes the housing 3 formed in a box shape, and the terminals 5 derived from the inside to the outside of the housing 3 to be exposed and extending along the wall surfaces 35 of the housing 3. The housing 3 includes a pair of projecting portions 39*a* formed by causing both external ends of the end portions in the end surface on the side where the terminals 5 are derived to project beyond the terminals 5. The external ends are external ends in the width direction crossing the extending direction, and the end portions are located on the deriving source side in the extending direction in which the terminals 5 extend. Each of the terminals 5 has an exposed portion that is located on the imaginary plane P, or closer to the wall surface 35 than the imaginary plane P is. The imaginary plane P includes a pair of corner portions 3*a* and end portions 39*c*. The corner portions 3*a* serve as corner portions of the wall surface 35 facing the terminals 5 and are located on the distal end side in the extending direction of the terminals 5 and at both external ends in the width direction, and the end portions 39*c* are end portions of the projecting portions 39*a* and located on the drawing side of the terminals 5, on the corner portions 3*a* side, and on the external end side in the width direction. In addition, with the electronic component 1 explained above, the distal end position in the extending direction of each of the terminals 5 is located on the imaginary plane P, or closer to the wall surface 35 than the imaginary plane P is. Besides, with the electronic component 1 explained above, the imaginary plane P is a plane on one side of which the whole housing 3 is located with the imaginary plane P serving as the boundary.

In other words, the electronic component 1 explained above includes a housing 3 formed in a box shape, and the terminals 5 derived from the inside to the outside of the housing 3 to be exposed and extending along the wall surfaces 35 of the housing 3. The housing 3 includes a pair of projecting portions 39*a* formed by causing both external ends of the end portions in the end surface on the side where the terminals 5 are derived to project beyond the terminals 5. The external ends are external ends in the width direction crossing the extending direction, and the end portions are located on the deriving source side in the extending direction in which the terminals 5 extend. Each of the terminals 5 has an exposed portion that is located on the imaginary plane P, or closer to the wall surface 35 than the imaginary plane P is. The imaginary plane P includes a pair of corner portions 3a and corner portions (end portions 39c in this example) of the projecting portions 39a. The corner portions 3a serve as corner portions of the wall surface 35 facing the terminals 5 and are located on the distal end side in the extending direction of the terminals 5 and at both external ends in the width direction, and the whole housing 3 is located on one side of the imaginary plane P with the plane serving as the boundary.

With this structure, the electronic component 1 has the structure in which the exposed portion of each of the terminals 5 extending along the wall surface 35 of the housing 3 is located on the imaginary plane P, or closer to the wall surface 35 than the imaginary plane P is, and the imaginary plane P includes a pair of corner portions 3a and part (end portions 39c in this example) of a pair of projecting portions 39a. With this structure, the electronic component 1 enables the corner portions 3a and the projecting portions 39a to contact a surface on which the electronic component 1 has fallen, before the exposed portions of the terminals 5 contact the surface, for example, when the electronic component 1 falls by accident. Consequently, the electronic component 1 enables protection of the terminals 5 with the corner portions 3a and the projecting portions 39a, and enables prevention of, for example, damage or deformation of the terminals 5.

In addition, the electronic component 1 explained above has the structure in which the housing 3 includes the plate-like portion 39b that connects the projecting portions 39a, and the projecting portions 39a have a larger length in the extending direction than that of the plate-like portion 39b. With this structure, the electronic component 1 enables relative reduction in the projecting amount (projecting amount in the direction along the second width direction) of the projecting portions 39a in comparison with, for example, the case where the projecting portions 39a have a length in the extending direction that is equal to that of the plate-like portion 39b, with the achieved structure in which the exposed portion of each of the terminals 5 is located on the imaginary plane P, or closer to the wall surface 35 than the imaginary plane P is. The electronic component 1 also properly secures the strength of the projecting portions 39a that tend to collide with the surface first when the electronic component 1 falls, because the projecting portions 39a have a larger length in the extending direction than that of the plate-like portion 39b. Consequently, the electronic component 1 enables both reduction in size of the housing 3 and securement of the strength.

The electronic component 1 explained above also has the structure in which each of the terminals 5 is located inside the outermost positions in the width direction of the wall surface 35 facing the terminal 5. With this structure, the electronic component 1 enables the outermost positions in the first width direction of each of the wall surfaces 35 to contact the surface on which the electronic component 1 has fallen, before the exposed portions of the terminals 5 contact the surface, even when the whole electronic component 1 is rotated around the rotation axis being a line connecting the corner portion 3a with the end portion 39c of the projecting portion 39a after the projecting portions 39a have collided with the surface. Consequently, the electronic component 1 enables protection of the terminals 5 with the outermost end portions in the width direction of each of the wall surfaces 35, and enables prevention of, for example, damage or deformation of the terminals 5.

The electronic component according to the embodiment of the present invention described above is not limited to the above embodiment, and may be variously modified within the range described in the claims.

The electronic component main body 4 explained above has been explained as a relay, but is not limited thereto. The electronic component main body 4 may be a connector, a fuse, a branch part, an electronic control unit, or the like.

Each of the electronic components 1 explained above includes four terminals, that is, the first terminal 51, the second terminal 52, the third terminal 53, and the fourth terminal 54, as the terminals 5, but is not limited thereto. Each electronic component 1 may include one terminal 5, or a plurality of terminals 5 of a number other than four. Although the terminals 5 have been explained with the structure of being formed along the respective wall surfaces 35 that are opposed in the second width direction in the housing 3, the structure thereof is not limited to the above. It suffices that the terminals 5 are formed along at least one of a pair of wall surfaces 35 and a pair of wall surfaces 36. Specifically, the terminals 5 may be formed along respective wall surfaces 36 that are opposed in the first width direction, or formed along the wall surface 35 and the wall surface 36, respectively, and bulging portions 39 and the like may be formed in accordance with the structure.

Although each of the bulging portions 39 explained above includes a pair of projecting portions 39a and the plate-like portion 39b, it suffices that each bulging portion 39 includes at least a pair of projecting portions 39a, and each bulging portion 39 may include no plate-like portion 39b.

Although the electronic component unit 100 explained above includes the engaging projecting portions 38 and the engaging recessed portions 27 as mechanisms to lock the electronic components 1 in the housing member 2, the electronic component unit 100 may include no engaging projecting portions 38 or engaging recessed portions 27, as long as the electronic components 1 can be locked in the housing member 2 by the holding force for the terminals 5 and the other end's terminals 6.

Although the housing 3 explained above is formed in a rectangular parallelepiped box shape with the base 31 and the case 32, the structure thereof is not limited to the above. The housing 3 may not be divided into the base 31 and the case 32, or may be formed in a polygonal box shape other than a rectangular parallelepiped.

An electronic component according to the present invention has a structure in which an exposed portion of each terminal extending along the wall surface of the housing is located on an imaginary plane, or closer to the wall surface than the imaginary plane is. The imaginary plane includes a pair of corner portions and part of a pair of projecting portions. With this structure, the electronic component enables the corner portions and the projecting portions to contact a surface on which the electronic component has fallen, before the exposed portion of the terminal contacts the surface, for example, when the electronic component falls by accident. Consequently, the electronic component produces an effect of protecting the terminal with the corner portions and the projecting portions.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electronic component comprising:
a housing formed to have a box shape; and
a terminal derived from inside to outside of the housing to be exposed and extending along a wall surface of the housing; wherein
the housing includes a pair of projecting portions formed by causing both external ends of end portions in an end surface on a side where the terminal is derived to project beyond the terminal, the external ends are external ends in a width direction crossing an extending direction in which the terminal extends, the end portions are located on a deriving source side in the extending direction,
the terminal has an exposed portion which is located on an imaginary plane, or closer to the wall surface than the imaginary plane is, the imaginary plane includes a pair of corner portions of the wall surface facing the terminal and end portions of the projecting portions, the corner portions are located on a distal end side in the extending direction of the terminal and at both external ends in the width direction, and the end portions are located on a drawing side of the terminal, on the corner portions side, and on an external end side in the width direction.

2. The electronic component according to claim 1, wherein a distal end position of the terminal in the extending direction is located on the imaginary plane, or located closer to the wall surface than the imaginary plane is.

3. The electronic component according to claim 2, wherein the housing includes a plate-like portion connecting the projecting portions, and
the projecting portions have a larger length in the extending direction than a length of the plate-like portion.

4. The electronic component according to claim 2, wherein the terminal is located inner than outermost positions in the width direction of the wall surface facing the terminal.

5. The electronic component according to claim 2, wherein the imaginary plane is a plane on one side of which the whole housing is located with the imaginary plane serving as a boundary.

6. The electronic component according to claim 1, wherein the housing includes a plate-like portion connecting the projecting portions, and
the projecting portions have a larger length in the extending direction than a length of the plate-like portion.

7. The electronic component according to claim 6, wherein the terminal is located inner than outermost positions in the width direction of the wall surface facing the terminal.

8. The electronic component according to claim 6, wherein the imaginary plane is a plane on one side of which the whole housing is located with the imaginary plane serving as a boundary.

9. The electronic component according to claim 1, wherein the terminal is located inner than outermost positions in the width direction of the wall surface facing the terminal.

10. The electronic component according to claim 1, wherein
the imaginary plane is a plane on one side of which the whole housing is located with the imaginary plane serving as a boundary.

11. The electronic component according to claim 9, wherein
the imaginary plane is a plane on one side of which the whole housing is located with the imaginary plane serving as a boundary.

12. An electronic component comprising:
a housing formed to have a box shape; and
a terminal derived from inside to outside of the housing to be exposed and extending along a wall surface of the housing; wherein
the housing includes a pair of projecting portions formed by causing both external ends of end portions in an end surface on a side where the terminal is derived to project beyond the terminal, the external ends are external ends in a width direction crossing an extending direction in which the terminal extends, the end portions are located on a deriving source side in the extending direction,
the terminal has an exposed portion which is located on an imaginary plane, or closer to the wall surface than the imaginary plane is, the imaginary plane includes a pair of corner portions of the wall surface facing the terminal and corner portions of the projecting portions, the corner portions of the wall surface are located on a distal end side in the extending direction of the terminal and at both external ends in the width direction, and the imaginary plane is a plane on one side of which the whole housing is located with the plane serving as a boundary.

* * * * *